United States Patent

Przybysz et al.

[11] Patent Number: 5,812,078
[45] Date of Patent: Sep. 22, 1998

[54] JOSEPHSON JUNCTION DIGITAL TO ANALOG CONVERTER FOR ACCURATE AC WAVEFORM SYNTHESIS

[75] Inventors: John Xavier Przybysz, Pittsburgh; Anthony Hodge Worsham, Oakmont, both of Pa.; Samuel Paul Benz, Superior; Clark Allen Hamilton, Boulder, both of Colo.

[73] Assignee: Northrop Grumman Corporation, Los Angeles, Calif.

[21] Appl. No.: 861,732

[22] Filed: May 22, 1997

[51] Int. Cl.$^6$ ........................................ H03M 1/00
[52] U.S. Cl. ............................. 341/133; 341/143
[58] Field of Search ........................ 341/133, 143, 341/171

[56] References Cited

U.S. PATENT DOCUMENTS

| | | | |
|---|---|---|---|
| 4,344,052 | 8/1982 | Davidson | 333/222 |
| 5,140,324 | 8/1992 | Prybysz et al. | 341/133 |
| 5,198,815 | 3/1993 | Przybysz et al. | 341/133 |
| 5,272,479 | 12/1993 | Silver | 341/133 |
| 5,327,130 | 7/1994 | Kang et al. | 341/133 |
| 5,341,136 | 8/1994 | Przybysz | 341/133 |
| 5,351,049 | 9/1994 | Lee et al. | 341/133 |
| 5,565,866 | 10/1996 | Hamilton et al. | 341/133 |

OTHER PUBLICATIONS

"Fundamentals of Giaever And Josephson Tunneling", *The New Superconducting Electronics*, ed. by Harold Weinstock and Richard W. Ralston, Kluwer Academic Publishers, 1993, pp. 1–28.

"Superconducting–Normal–Superconductor Junctions for Digital/Analog Converters", S.P. Benz, National Institute of Standards and Technology, Boulder, CO 80303.

"Josephson Voltage Standard—A Review", Clark A. Hamilton, Charles J. Burroughs and Samuel P. Benz, National Institute of Standards and Technology, Boulder, CO 80303.

"RF–Induced Steps In A Pulse Driven Josephson Junction", S. Maggi, *European Conf. On Applied Superconductivity*, Edinburgh 3–7, Jul. 1995, pp. 1–4.

*Primary Examiner*—Marc S. Hoff
*Assistant Examiner*—Peguy Jean Pierre
*Attorney, Agent, or Firm*—Walter G. Sutcliff

[57] ABSTRACT

A low noise accurate signal generator for a calibration system or a radar system includes a generator of a digital data stream having a predetermined frequency spectrum incorporated therein. A series connected array of Josephson junctions is coupled to and excited by the digital data stream to provide a stream of pulses with quantum mechanically accurate time integral. A low pass analog signal filter is coupled to the pulses of accurate time integral for extracting analog signals of the predetermined frequency spectrum. For radar applications, a low phase-noise local oscillator of a fixed RF frequency and the output of the filter are coupled to a signal mixer which outputs low phase-noise chirped RF signals for use in generating transmit pulses for the radar system whereby enhanced detection of targets in "clutter" can be obtained.

31 Claims, 1 Drawing Sheet

JOSEPHSON JUNCTION DIGITAL TO ANALOG CONVERTER FOR ACCURATE AC WAVEFORM SYNTHESIS

BACKGROUND OF THE INVENTION

1. Field of the Invention

This invention relates generally to digital to analog signal converters and more particularly to a low phase noise digital to analog converter utilizing Josephson junctions in connection with programmable voltage standards for metrologically accurate waveform synthesis and cryogenic radar systems.

2. Description of Related Art

Josephson junctions are well known devices consisting of two superconductors separated by a thin film of dielectric material or normal metal. Such devices are typically comprised of superconducting layers of Nb separated by $Al_2O_3$ or superconducting layers of $YBa_2Cu_3O_7$ separated by Co doped $YBa_2Cu_3O_7$ and produce quantum mechanically accurate voltage pulses generated as a result of phase slips in the quantum wave function of the superconductor system. This is accomplished by exploiting the now well known Josephson effect which is characterized by absolutely repeatable constant voltage steps in the junction's current-voltage characteristic. For a detailed treatment of Josephson junctions, one can refer to "Fundamentals Of Giaever And Josephson Tunneling", Y. Bruynseraede et al, *The New Superconducting Electronics*, ed. by Harold Weinstock and Richard W. Ralston, Kluwer Academic Publishers, 1993, pp. 1–28.

In metrology applications, primary standards for AC voltage presently rely on thermal voltage converters that compare the heating effect of AC and DC inputs. Direct waveform synthesis from an accurate AC voltage source would provide the first independent check of the accuracy of thermal voltage converters and change the fundamental method of AC metrology from detector-based to source-based calibrations. The Josephson D/A converter in accordance with the present invention will be the first such programmable voltage standard source.

In radar systems implemented with RF signal generators employing cryogenic techniques, low phase noise RF signals can be obtained from cooled dielectric resonators, e.g. sapphire resonators. However, the signal generated is a continuous wave signal of a single frequency. In order to enable such a radar system to provide range compression, it becomes necessary to produce low phase-noise carrier frequencies which are swept both linearly and non-linearly during the transmitted pulse. This is known to those skilled in the art as "chirp". Accordingly, the present invention also pertains to cryogenic radar systems.

SUMMARY

It is an object of the present invention, therefore, to provide an improvement in the generation of time-dependent waveforms.

It is a further object of the invention to provide a waveform generator for programmable voltage standards and radar systems which include a digital to analog signal converter wherein a digital data stream is converted to low noise analog voltages.

It is another object of the invention to provide a digital to analog signal converter wherein the analog signal has quantum mechanically accurate time-dependent voltages.

The foregoing and other objects are achieved by a method and apparatus including a waveform generator comprising means for generating a digital data stream having a predetermined frequency spectrum incorporated therein, a plurality of series coupled Josephson junctions coupled to and excited by the digital data stream to provide a digital data stream output having voltage pulses with quantum mechanically accurate time-integral, and a low pass analog signal filter coupled to the pulses for retrieving analog signals. For metrology applications, the output of the low pass filter is the signal of interest because it has a calculable time-dependent voltage. For radar applications, a low phase-noise local oscillator of a fixed frequency, a mixer responsive to the respective outputs of the local oscillator, and the low pass filter is used for generating low phase-noise RF chirp signals for use in generating transmit pulses for the radar system and which provides enhanced detection of targets in "clutter".

Further scope of applicability of the present invention will become apparent from the detailed description of the invention provided hereinafter. It should be understood, however, that the detailed description and specific examples, while indicating preferred embodiments of the invention, are provided by way of illustration only, since various changes, alterations and modifications coming within the spirit and scope of the invention will become apparent to those skilled in the art from the detailed description.

BRIEF DESCRIPTION OF THE DRAWINGS

The present invention will become more fully understood when considered together with the accompanying drawings which are provided by way of illustration only and thus are not limitative of the present invention, and wherein.

DETAILED DESCRIPTION OF THE PREFERRED EMBODIMENT

The present invention is based upon the ability of Josephson junctions to produce an output pulse of a single flux quantum $\phi_0$ when an excitation pulse causes its critical current $I_c$ to be exceeded. This mechanism is well known in the art, having been discovered in 1962 by B. D. Josephson.

The Josephson effect manifests itself as a time-dependent voltage across the junction consisting of quantized voltage pulses with a time-integral equal to the flux quantum unit $\Phi_0 = h/2e$, where h is Planck's constant and e is the elementary charge. When a digital pulse train with an appropriate amplitude is applied across one or more Josephson junctions, each input current pulse generates a corresponding output voltage pulse across each junction and the time integral of each voltage pulse is perfectly quantized. This phenomenon is used in the subject invention to generate time-dependent voltage waveforms with accuracy not currently obtainable with other types of technology.

Figure 1:
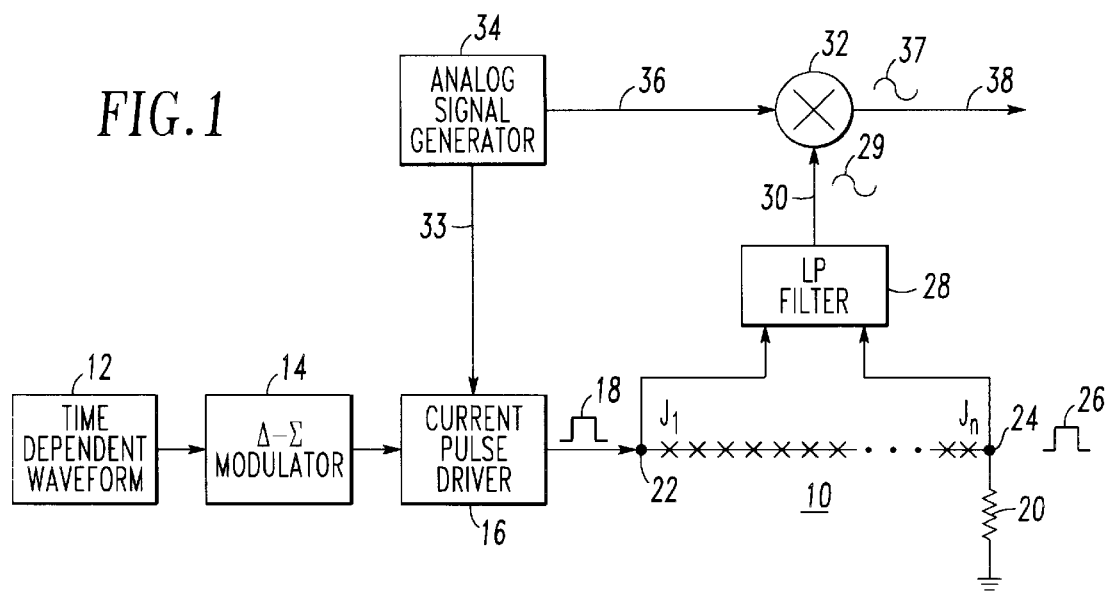
FIG. 1 is a block diagram illustrative of one preferred embodiment of the subject invention and where the mixer is only relevant to a radar application.

Referring now to FIG. 1, an essential component of the invention is the Josephson quantizer 10, which is typically comprised of a plurality of series connected Josephson junctions $J_1, J_2, \ldots J_{n-1}, J_n$. The quantizer 10 is fed a binary digital data stream 18 having a desired spectrum implemented in its digital pattern. To prevent reflections and ensure uniform transmission of the digital data stream to each junction, the series array is embedded in a high impedance transmission line that is terminated by an impedance matched resistor 20.

As shown in FIG. 1, the binary digital data stream is generated by a digital waveform generator including, for example, a time-dependent waveform source 12, and a delta-sigma (Δ-Σ) modulator 14. The time-dependent waveform from the source 12 describes an analog signal such as a DC voltage, a pure sinewave, or a band of chirp frequencies, where chirp is meant to include both linear and nonlinear frequency modulated (FM) frequencies which are swept over a predetermined frequency range. This time-dependent signal is converted to a digital pulse train by the Δ-Σ modulator 14 in a well known manner. A current pulse driver 16, which could be realized as a digital pulse pattern generator, is used to current bias the Josephson junction quantizer 10. The output of the Δ-Σ modulator 14 and current pulse driver 16 consists of a binary digital pulse train 18 which includes the frequency spectrum of the desired waveform from the source 12.

While such pulses are adequate for use with digital logic circuits, the amplitude and phase of the digital ONE pulses may not necessarily be uniform. For example, existing digital signal generators typically have voltage and phase noise that is both correlated and uncorrelated to the binary digital code bit density. Such a pulse train, however, when applied to the Josephson quantizer 10 by the current pulse driver 16 produces a corresponding digital output across terminals 22 and 24 which consists of a pulse train 26 where every pulse representing a binary ONE has a quantum mechanically accurate time integral. When the pulse train signal 26 appearing across terminals 22 and 24 is coupled to a low pass filter 28 as shown in FIG. 1, an analog signal 29 which is substantially noise free and which corresponds to the requested time-dependent waveform from the source 12 will be transmitted on circuit lead 30. The analog signal generator provides a high frequency clock signal that controls the current pulse driver 16 via signal lead 33. The foregoing description is sufficient for general applications of the Josephson digital to analog converter, such as metrology applications.

For radar applications, however, the analog signal generator 34 provides a relatively low phase noise clock signal to control the current pulse driver 16 via lead 33. Such a low phase noise signal can be provided by a cryogenic stabilized local oscillator (STALO). This low phase noise signal is additionally fed via lead 36 to signal mixer 32 which also receives the signal on lead 30. The mixer generates a low phase-noise output signal 37 which appears on circuit lead 38 and which can then be used in the generation of RF pulses transmitted by a radar system, not shown.

Figure 2:
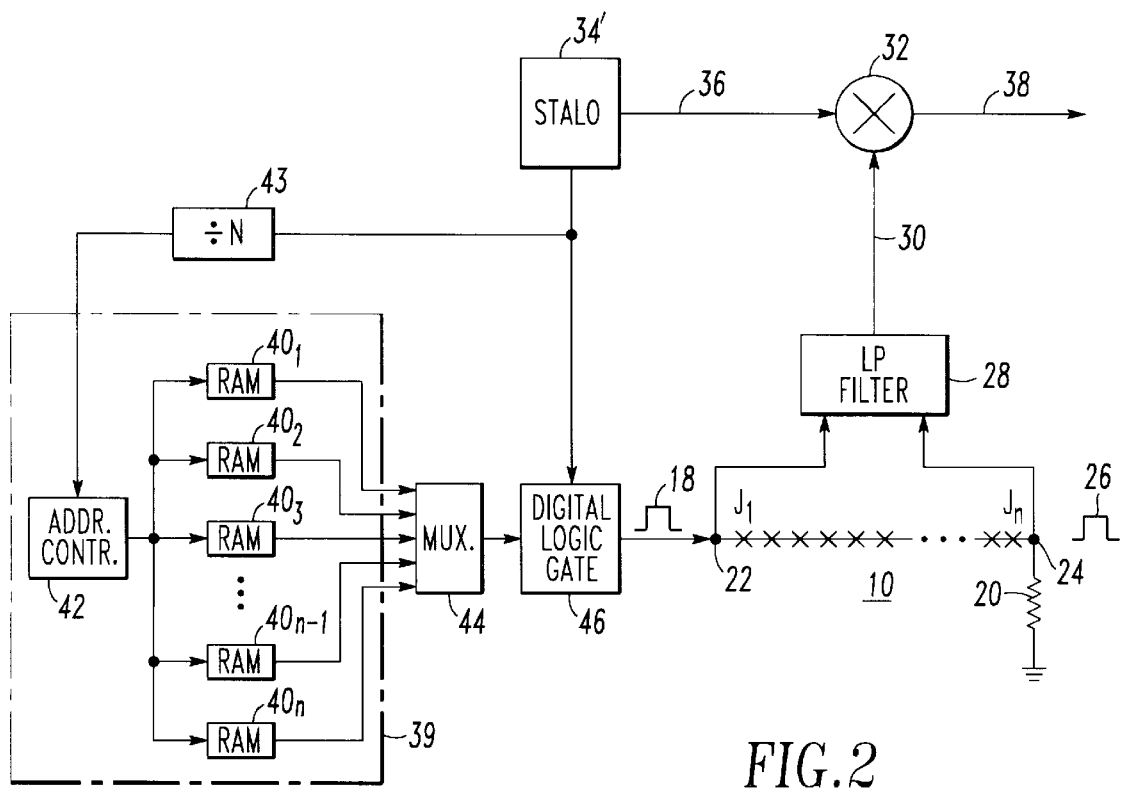
FIG. 2 is a block diagram illustrative of a second preferred embodiment of the subject invention.

The foregoing is made by way of preface to the preferred embodiment of the invention as a low phase noise radar signal generator which is shown in FIG. 2. Referring now to FIG. 2, shown there at is apparatus including a digital to analog converter for generating low phase-noise analog X-band signals utilizing a Josephson junction array 10 which is excited by the digital ONE amplitudes of a digital data stream 18 which includes a spectrum of chirp signals.

The digital data stream 18 is now generated by a digital waveform generator 39 comprised of a set of random access memories (RAMs) $40_1 \ldots 40_n$ which are programmed with a desired binary sequence representative of the chirp signals and which are controlled by an address controller 42. The controller 42 is shown clocked at a rate derived from a clock signal generated by a stabilized oscillator (STALO) 34' which comprises a cryogenically cooled dielectric (sapphire) resonator which generates a fixed RF frequency of 10 GHz. The rate at which the address controller 42 is clocked is a sub-multiple of the clock frequency and is provided by a frequency divider 43. The selected binary outputs from the RAMs $40_1 \ldots 40_n$ are multiplexed into a single data stream by a multiplexer 44, where it is then used to drive the Josephson junction array 10 via a high speed semiconductor digital logic gate 46 also clocked by the STALO 34'.

The output 26 of the Josephson array 10 comprises a corresponding binary waveform sequence wherein each and every digital ONE pulse has an identical quantum mechanically precise time integral, which when fed to a low-pass filter 28 having a pass-band from DC to 20 MHz, provides low phase-noise analog voltage signals corresponding to the output of digital waveform generator 39. Such a configuration can generate an RF chirp output from the mixer 32, which can then be fed to a radar transmitter, not shown, as an IF signal for the generation of chirped radar transmit pulses.

The validity of the subject scheme has been confirmed by two experiments performed at the National Institute of Standards and Technology in Boulder, Colo. In those experiments, 2 nanosecond ($2 \times 10^{-9}$ sec.) current pulses were applied to 512 Josephson junctions connected in series. The layout of the chip had the junctions at the center conductor of a 50-ohm coplanar waveguide structure. Since the voltage-state impedance of each junction was noted to be 4.4 milliohms, the total series impedance of 2 ohms was a small perturbation of the coplanar transmission line. Thus the amplitude of the excitation pulse was substantially the same at the last junction as it was at the first junction. Furthermore, in these experiments, the DC current-voltage characteristic of the Josephson junction array changed with frequency of the applied pulses. At 250 MHz, constant voltage steps were measured which had a spacing of about 250 microvolts. This time-averaged DC voltage corresponds to a single output pulse per junction per excitation pulse, which is expressed as: $V=Nf\phi_0$, where N is the number of junctions, f is the excitation pulse frequency, and $\phi_0$ is the single flux quantum voltage pulse having a magnitude of 207 microvolts per GHz.

The basic Δ-Σ function of producing a lower output voltage when the excitation pulses occur less frequently was also confirmed in the NIST experiments. When the 2 nanosecond excitations were applied at 100 MHZ rate, the voltage steps occurred at 106 microvolt intervals, while at 10 MHz pulse rate, the voltage steps occurred at 10.6 microvolt intervals.

Thus what has been shown and described is a digital-to-analog converter based on the quantum mechanical accuracy of Josephson junctions that can be used for generating accurate time-dependent waveforms. This accurate voltage source may be used as a programmable voltage standard for metrology applications. For cryogenic radar systems, it can be combined with the low phase-noise of a cryogenically cooled dielectric (sapphire) resonator acting as a stabilized local oscillator, thereby allowing pulse compression to be implemented so as to improve detection of targets in clutter which would otherwise not be detected.

Thus having shown and described what is at present considered to be the preferred embodiment of the invention, it should be noted that the same has been made by way of illustration and not limitation. Accordingly, all modifications, alterations and changes coming within the spirit and scope of the invention as set forth in the appended claims are herein meant to be included.

We claim:

1. Apparatus for generating an accurately known time dependent signal comprising:

means for generating a high clock frequency digital data stream whose Fourier spectrum lies within a predetermined frequency band and is an approximation of a time dependent signal of a relatively lower frequency;

a Josephson junction quantizer for converting said digital data stream to a matching stream of quantum mechanically accurate pulses having a time integral of h/2e where h is Planck's constant and e is the elementary charge;

a current pulse driver, coupled between said means for generating a digital data stream and said quantizer, for generating current pulses applied to said quantizer;

an analog signal generator for generating a relatively high frequency analog signal for controlling said driver; and a signal filter for said stream of quantum mechanically accurate pulses coupled to said quantizer for eliminating quantization noise and recovering said time-dependent signal.

2. Apparatus in accordance with claim 1 wherein said quantizer comprises at least one Josephson junction.

3. Apparatus in accordance with claim 1 wherein said quantizer comprises an array of Josephson junctions.

4. Apparatus in accordance with claim 1 wherein said driver comprises a digital signal generator.

5. Apparatus in accordance with claim 1 wherein said digital data stream is generated using delta-sigma modulation.

6. Apparatus in accordance with claim 1 wherein said filter comprises a low pass filter.

7. Apparatus in accordance with claim 1 wherein said filter comprises a band pass filter.

8. Apparatus in accordance with claim 1 wherein said time dependent signal is constant for an interval required to perform a DC calibration.

9. Apparatus in accordance with claim 1 wherein said time dependent signal comprises a sine wave.

10. Apparatus in accordance with claim 1 wherein said spectrum comprises RF frequencies which are swept across said predetermined frequency band.

11. Apparatus in accordance with claim 1 wherein said driver includes at least one random access memory programmed with a binary sequence representative of said time-dependent signal.

12. Apparatus for generating a low phase noise signal for use in a radar system, comprising:

means for generating a high clock frequency digital data stream whose Fourier spectrum lies within a predetermined frequency band and is an approximation of a time dependent signal of a relatively lower frequency;

a Josephson junction quantizer for converting said digital data stream to a matching stream of quantum mechanically accurate pulses having a time integral of h/2e where h is Planck's constant and e is the elementary charge;

a current pulse driver, coupled between said means for generating a digital data stream and said quantizer, for generating and applying current pulses to said quantizer;

an analog signal generator for generating a relatively high frequency signal, having a relatively low phase noise for controlling said current pulse driver;

a signal filter coupled to said stream of quantum mechanically accurate pulses for eliminating quantization noise and recovering said time-dependent signal;

a signal mixer coupled to said analog signal generator and said signal filter, said mixer being responsive to said relatively high frequency signal and said time-dependent signal recovered by said filter and generating therefrom a low phase-noise RF output signal for use in a transmitter forming a part of a radar system.

13. Apparatus in accordance with claim 12 wherein said quantizer is comprised of at least one Josephson junction.

14. Apparatus in accordance with claim 12 wherein said quantizer comprises a plurality of Josephson junctions.

15. Apparatus in accordance with claim 12 wherein said driver comprises a digital signal generator.

16. Apparatus in accordance with claim 12 wherein said digital data stream is generated using delta-sigma modulation.

17. Apparatus in accordance with claim 12 wherein said filter comprises a low pass filter.

18. Apparatus in accordance with claim 12 wherein said filter comprises a band pass filter.

19. Apparatus in accordance with claim 12 wherein said spectrum comprises RF frequencies which are swept across said predetermined frequency band.

20. Apparatus in accordance with claim 12 wherein said spectrum comprises a band of RF frequencies which are swept linearly or non-linearly across said predetermined frequency band.

21. Apparatus in accordance with claim 12 wherein said driver includes at least one random access memory programmed with a binary sequence representative of said time-dependent signal.

22. Apparatus in accordance with claim 12 wherein said driver includes a plurality of random access memories programmed with a binary sequence representative of a predetermined band of chirp RF frequencies and multiplexer means coupled between said random access memories and a digital logic gate connected to said Josephson junction quantizer.

23. Apparatus in accordance with claim 12 wherein said analog signal generator comprises a dielectric resonator.

24. Apparatus in accordance with claim 12 wherein said analog signal generator comprises a cryogenically cooled dielectric resonator.

25. A method of generating an accurately known time dependent signal, comprising the steps of:

generating a high clock frequency digital data stream whose Fourier spectrum lies within a predetermined frequency band and is an approximation of a time dependent signal having a relatively lower frequency;

using one or more Josephson junctions to convert said digital data stream to a matching stream of quantum mechanically accurate pulses having a time integral of h/2e where h is Planck's constant and e is the elementary charge;

filtering said stream of quantum mechanically accurate pulses to eliminate quantization noise and recover said time dependent signal.

26. A method in accordance with claim 25 wherein said step of generating comprises generating a binary sequence representative of said time-dependent signal.

27. A method in accordance with claim 25 wherein said time dependent signal comprises a sine wave.

28. A method in accordance with claim 25 wherein said time dependent signal is constant for an interval required to perform a DC calibration procedure.

29. A method for generating a low pass noise signal for use in a radar system, comprising:

generating a high clock frequency digital data stream whose Fourier spectrum lies within a predetermined frequency band and is an approximation of a time dependent signal of a relatively lower frequency;

converting said digital data stream to a matching stream of quantum mechanically accurate pulses having a time integral of h/2e where h is Planck's constant and e is the elementary charge;

generating a relatively high frequency analog signal with a relatively low phase noise, filtering said stream of quantum mechanically accurate pulses for eliminating quantization noise and recovering said time-dependent signal; and mixing said relatively high frequency analog signal and said time-dependent signal and generating therefrom a low phase-noise RF output signal for use in a transmitter forming a part of a radar system.

30. A method in accordance with claim 29 wherein said step of generating comprises generating a binary sequence representative of said time dependent signal.

31. A method in accordance with claim 29 wherein said step of generating comprises generating a binary sequence representative of a predetermined band of chirp RF frequencies.

* * * * *

UNITED STATES PATENT AND TRADEMARK OFFICE
CERTIFICATE OF CORRECTION

PATENT NO. : 5,812,078
DATED : September 22, 1998
INVENTOR(S) : John X. Przybysz, et al It is certified that error appears in the above-identified patent and that said Letters Patent is hereby corrected as shown below:

On the title page, item [73] Assignee, add the following:

--National Institute of Standards and Technology (NIST), Gathersburg, Maryland--.

Signed and Sealed this

Twentieth Day of July, 1999

*Attest:*

Q. TODD DICKINSON

*Attesting Officer*    Acting Commissioner of Patents and Trademarks